United States Patent [19]
Bertotti et al.

[11] Patent Number: 4,641,171
[45] Date of Patent: Feb. 3, 1987

[54] MONOLITHICALLY INTEGRATED SEMICONDUCTOR POWER DEVICE

[75] Inventors: Franco Bertotti, Milan; Giuseppe Ferla, Catania; Salvatore Musumeci, Riposto; Salvatore Raciti, Belpasso, all of Italy

[73] Assignee: SGS Microelectronica SpA, Agrate Brianza, Italy

[21] Appl. No.: 776,961

[22] Filed: Sep. 17, 1985

[30] Foreign Application Priority Data

Sep. 21, 1984 [IT] Italy ................... 6620 A/84

[51] Int. Cl.⁴ ........................... H01L 27/02
[52] U.S. Cl. ........................... 357/46; 357/48
[58] Field of Search ........................... 357/46

[56] References Cited
U.S. PATENT DOCUMENTS
4,370,179 1/1983 Roger ................... 357/46

Primary Examiner—Edward J. Wojciechowicz
Attorney, Agent, or Firm—Wenderoth, Lind & Ponack

[57] ABSTRACT

A monolithic semiconductor device including an integrated control circuit and a pair of power transistors in a Darlington configuration integrated in the same chip solves the problem of ON-OFF switching which is prevented by the presence of parasitic transistors within the structure, these transistors preventing the correct operation of the device at saturation. The solution involves a suitable arrangement of the components in the chip, with the output transistor of the Darlington pair disposed in an intermediate position between the drive transistor of the pair and the integrated control circuit. The addition of semiconductor shields, disposed between the output transistor of the Darlington pair and the integrated control circuit further reduces the damaging effects of the parasitic transistors.

20 Claims, 4 Drawing Figures

MONOLITHICALLY INTEGRATED SEMICONDUCTOR POWER DEVICE

BACKGROUND OF THE INVENTION

The present invention relates to the structure of an electronic semiconductor device in particular comprising at least one integrated circuit and power components integrated monolithically on the same chip of semiconductor material.

The association in the same silicon chip of high voltage power transistors with a vertical current flow from the emitter to the collector and an integrated control circuit provides a very compact and efficient device which is economical to produce and which satisfies current industrial requirements.

A device of this type, disclosed in the Italian Patent Application 6616 A/84 of Aug. 21, 1984 in the name of the applicants, involves the use of planar junctions with a very high breakdown voltage thereby enabling the device to be used in high voltage power applications.

The high voltage arrangement of P-N planar junctions is achieved by means of a stepped profile and a concentration of impurities in one of the two sides of the junction which decreases from the center to the periphery with a predetermined extension.

The device constructed in this way is not, however, able to operate correctly during switching. In effect, since there are several regions of opposite types of conductivity within the chip, parasitic bipolar transistors are produced. These are not disadvantageous when the high voltage planar junctions of the device are reverse biased since in this case both the emitter-base and collector-base junctions of the parasitic transistors are reverse biased. They are, however, damaging when the power transistors, controlled by the integrated circuit, are brought into the saturation state. In this case the firing of parasitic elements which inject current into the isolation region, which has within it the integrated circuit, causes the forward biasing of the internal P-N junction existing on the boundary of the integrated circuit of the device with the surrounding isolation region when the threshold voltage of 0.6 V of the junction is exceeded. This leads to the loss of the electrical isolation and consequently causes incorrect operation and may even lead to the destruction of the integrated circuit of the device.

SUMMARY OF THE INVENTION

The main object of the present invention is to use a structure constructed by the planar process using conventional integrated circuit manufacturing techniques, and to eliminate the above-mentioned and other drawbacks which will be described below.

These and other objects are achieved in accordance with the present invention by disposing the integrated control circuit and the drive transistor of the Darlington pair remote from one another in the chip and by disposing the output power transistor in an intermediate position as a separation element.

In accordance with the present invention, there are also provided between the areas set aside for the output power transistor and the integrated control circuit, small, heavily doped, semiconductor regions which break up the horizontal continuity of the collector region of the device and which act as shields. The structure produced in this way makes the damaging effects of the parasitic transistors negligible with the result that the structure may operative correctly.

BRIEF DESCRIPTION OF THE DRAWINGS

An embodiment of the invention is described below by way of non-limiting example with reference to the attached drawings, in which.

The same reference numerals and letters are used in all of the drawing figures for corresponding components.

DESCRIPTION OF THE PREFERRED EMBODIMENT

Figure 1:
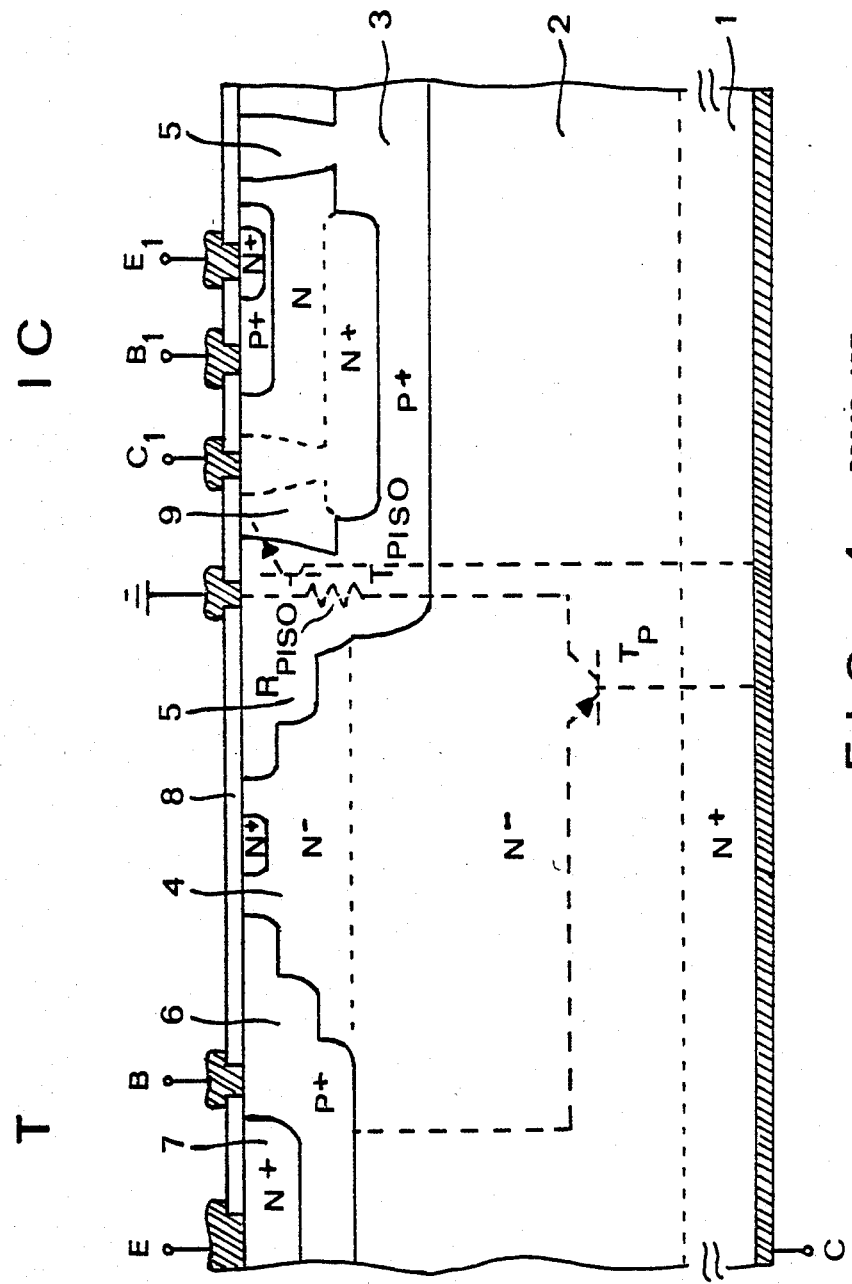
FIG. 1 shows a section, not to scale, through part of a chip comprising a device which has been monolithically integrated using known techniques.

With reference to FIG. 1 it can be seen that the components of the device of the prior art are formed in a substrate 1 of monocrystalline silicon. This substrate has deposited on it a first epitaxial layer 2 and subsequently a second epitaxial layer 4, both of high resistance, with a concentration of impurities of $10^{14}$ atoms/cm$^3$. An integrated control circuit IC, of which there is shown an NPN transistor with its emitter $E_1$, base $B_1$ and collector $C_1$ electrodes, is disposed close to the right-hand edge of the chip within an isolation region 3-5 (3 designating the horizontal and 5 the vertical portion of the isolation region) in the high voltage configuration and connected to the ground of the circuit arrangement in which the device is inserted. On the opposite side, close to the left-hand edge of the chip, there is disposed an NPN power transistor T which is in the high voltage configuration. The transistor is formed by a collector region, included in the layers 1-2-4, with a collector electrode C, a base region 6 with a base electrode B and an emitter region 7 with an emitter electrode E.

The electrodes, shown by crosshatched regions in the drawing figures, are all disposed on the same side of the chip, with the exception of the collector electrode C lying on the opposite side thereof. Metal paths, not shown in FIG. 1, are located on the insulation layer 8 of the chip and connect the output of IC to the power transistor T.

FIG. 1 also shows in dashed lines the following parasitic elements produced within the structure:

$T_p$: a PNP transistor produced between the transistor T and the integrated circuit IC, which has the regions 6, 1-2-4 and 3-5 as its emitter, base and collector regions respectively.

$T_{PISO}$: an NPN transistor produced in the isolation region 3-5 which comprises the integrated circuit, and which has the regions 9, 3-5 and 1-2-4 as its emitter, base and collector regions respectively.

$R_{PISO}$: a resistance of the vertical isolation region 5 of the IC.

When the power transistor is brought from the cut off state (OFF) to operation at saturation (ON) and therefore has its base-collector junction forwardly biased, the parasitic transistor $T_p$ is biased in the active zone and consequently, even if its gain is lower than unity, injects a portion of the collector current of T into the isolation region, or into one end of the resistance $R_{PISO}$. This current flows in $R_{PISO}$ and then to ground to which the other upper end of the resistance is connected. As soon as this current exceeds the value such that its product for the resistance $R_{PISO}$ reaches or exceeds the threshold voltage value 0.6 V, the base-emitter junction of the other transistor $T_{PISO}$ is forwardly biased. Consequently in this case the current which flowed exclusively in $R_{PISO}$ before, is by-passed towards the region 9, collected by the collector of the IC transistor and therefore causes the loss of the electrical isolation of the region 3-5 which surrounds the IC. It is this undesired flow of current which causes the incorrect operation of the monolithic device.

This leads to a technical problem which the invention solves by using a pair of high voltage power transistor in the Darlington configuration disposed in the chip with the output transistor of the pair in an intermediate position between the drive transistor of the pair and the integrated control circuit.

Figure 2:
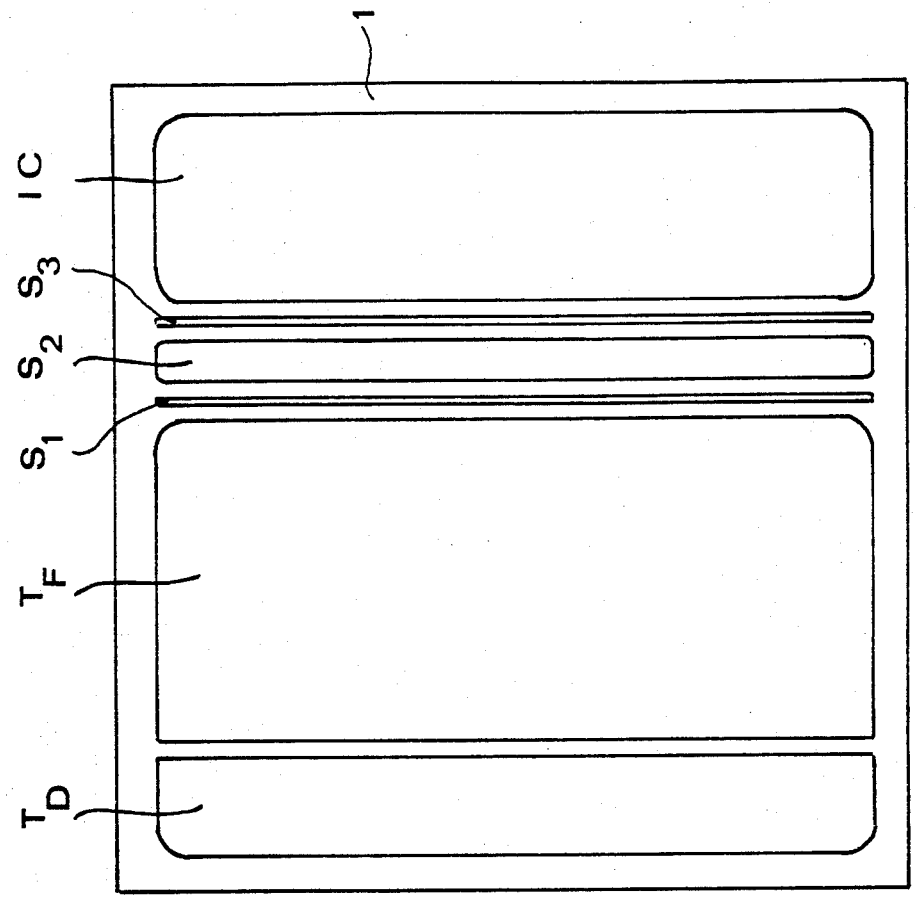
FIG. 2 is a plan view, not to scale, showing in diagrammatic form the arrangement in the chip of a monolithically integrated device constructed in accordance with the present invention.
Figure 3:
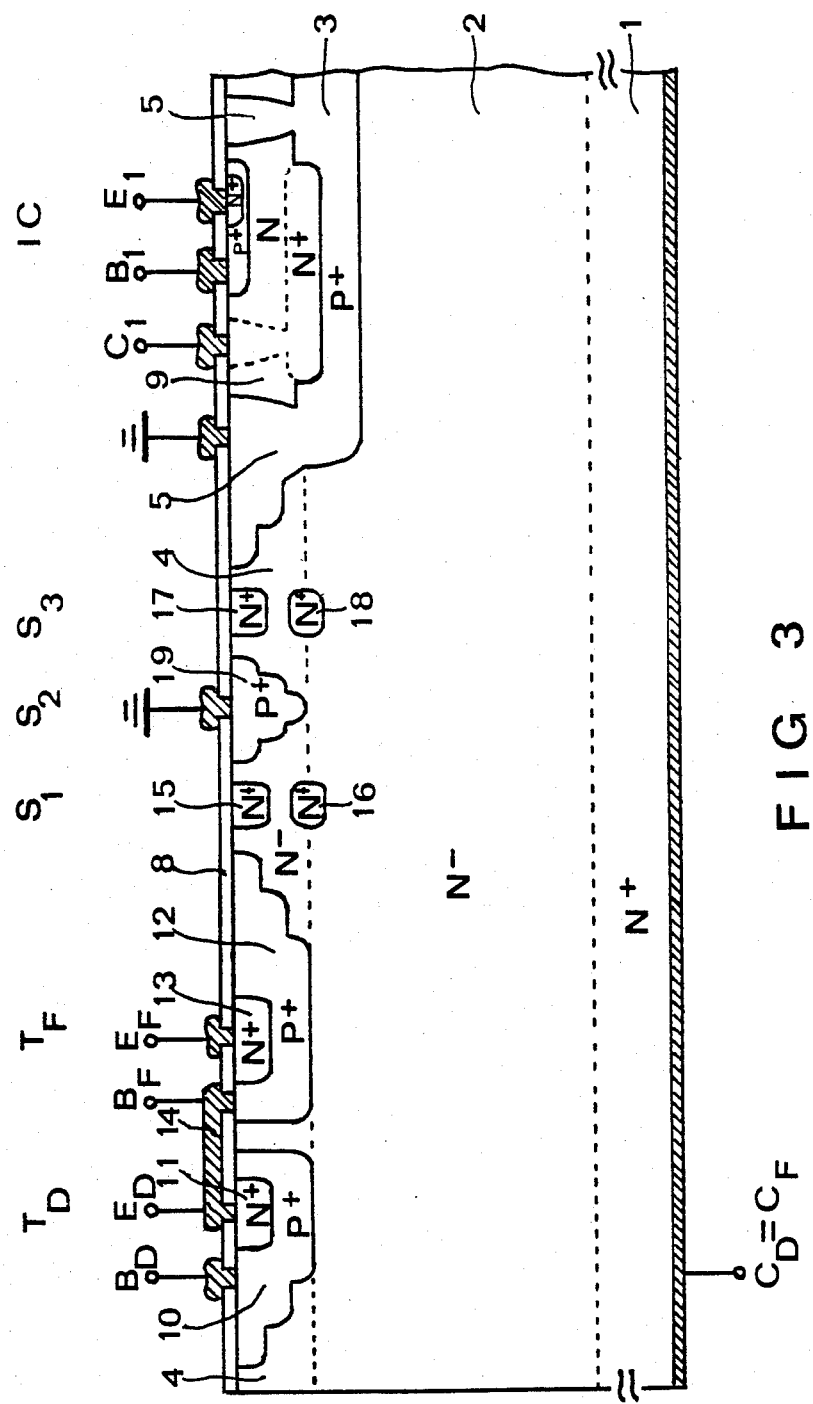
FIG. 3 shows a section, not to scale, through part of a chip comprising the device of FIG. 2.

With reference to FIGS. 2 and 3, it can be seen that the NPN drive transistor of the Darlington pair is located close to the left-hand edge of the chip in the high voltage configuration. This transistor is formed by a collector region contained in the layers 1-2-4 with a collector electrode $C_D$, and by a base region 10 with a base electrode $B_D$ and by an emitter region 11 with an emitter electrode $E_D$. The NPN output transistor $T_F$ of the Darlington pair is disposed centrally between $T_D$ and IC in the high voltage configuration, this transistor being formed by the same collector region 1-2-4 with a collector electrode $C_F$ which coincides with the electrode $C_D$, and a base region 12 with a base electrode $B_F$ and an emitter region 13 with an emitter electrode $E_F$. The electrode $E_D$ of $T_D$ is connected to the electrode $B_F$ of $T_F$ by a metal path 14 shown by a crosshatched region in FIG. 3. FIG. 3 does not show the connection between the output of the integrated circuit IC and the input of the drive transistor $T_D$ of the Darlington pair. Finally, the overall semiconductor shield, constructed from three single shields $S_1$, $S_2$, $S_3$, is disposed between the transistor $T_F$ and the integrated circuit.

Figure 4:
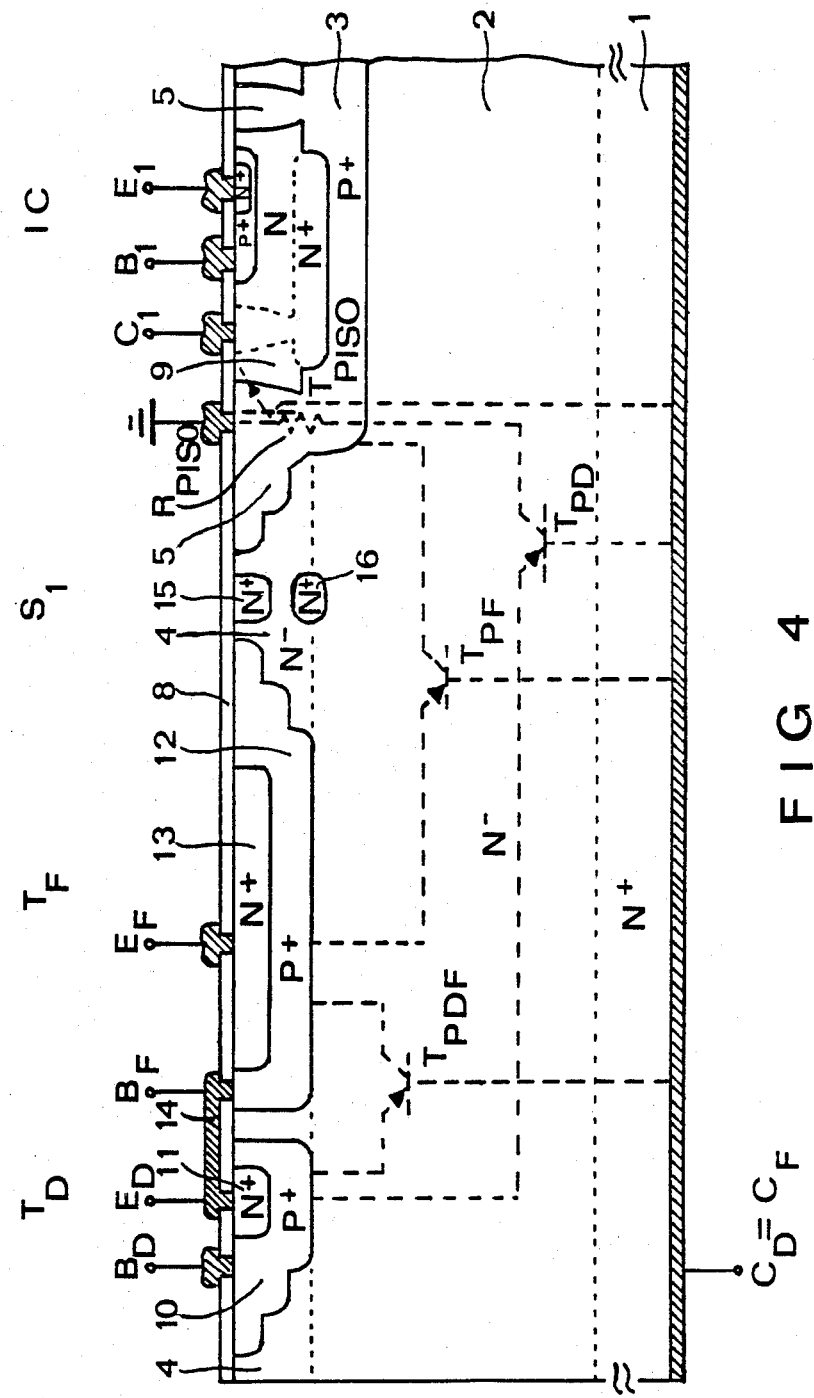
FIG. 4 shows the device of FIG. 3 with the addition of the parasitic transistors within the structure and shows the device with a shield which is less complex than that shown in FIGS. 2 and 3.

In FIG. 4, which shows the device of FIG. 3 with the exception that the shield located between the integrated circuit and the transistor $T_F$ is reduced to the single shield S1, there are shown, by dashed lines, the following parasitic elements within the structure of the invention:

$T_{PD}$: a PNP transistor produced between the transistor $T_D$ and the integrated circuit having the regions 10, 1-2-4 and 3-5 as its emitter, base and collector regions respectively;

$T_{PF}$: a PNP transistor produced between the transistor $T_F$ the integrated circuit having the regions 12, 1-2-4 and 3-5 as its emitter, base and collector regions respectively;

$T_{PDF}$: a PNP transistor produced between the transistor $T_D$ and $T_F$ of the Darlington pair having the regions 10, 1-2-4 and 12 as its emitter, base and collector regions respectively;

$T_{PISO}$: An NPN transistor produced between the isolation region 3-5 of the integrated circuit IC having the regions 9, 3-5 and 1-2-4 as its emitter, base and collector regions respectively;

$R_{PISO}$: a resistance of the vertical isolation region 5 of the IC.

Obviously, the parasitic elements $T_{PISO}$ and $R_{PISO}$ are identical to those of FIG. 1.

When the Darlington pair is brought from the cut-off state (OFF) to operate at saturation (ON), it is known that in these electrical operating conditions, the output transistor $T_F$ operates, in contrast to the transistor $T_D$, in a quasi-saturation state. This involves the parasitic transistor $T_{PF}$ produced between the transistor $T_F$ and the integrated circuit and which was cut off not being caused to conduct. The emitter-base junction of $T_{PF}$ is slightly forwardly biased in the worst case, and consequently the injection of the collector current of $T_F$ into $R_{PISO}$ becomes decidedly negligible with respect to the injection due to $T_{PD}$. For this reason, the invention uses the Darlington pair with the output transistor $T_F$ in an intermediate position between the integrated circuit and $T_D$.

In order to prevent the occurrence of a forward biasing voltage of the base-emitter junction of the parasitic transistor $T_{PISO}$, the invention reduces the current injected towards the isolation region of the integrated circuit, minimizing the gain $h_{FE}$ of the parasitic transistor $T_{PD}$ which is biased in the active zone following the switching. The invention achieves this result by maximizing the distance between the facing edges of $T_D$ and the IC such that the gain of $T_{PD}$ is $<<1$, and therefore disposing the Darlington pair on the chip with the output transistor in an intermediate position between the transistor $T_D$ and the integrated circuit and in the shape of a rectangle bounded by the two opposite sides of the chip.

Moreover, with this device the parasitic transistor $T_{PDF}$, which in any case exists within the Darlington pair, is used in accordance with the invention to by-pass to $T_F$ part of the collector current of $T_D$ which would otherwise flow entirely, via $T_{PD}$, into the resistance $R_{PISO}$.

Finally, the invention minimizes the undesirable and damaging effects of both $T_{PD}$ and $T_{PF}$ with the interposition of semiconductor shields essentially of two different types between $T_F$ and the integrated circuit IC.

With reference to FIGS. 2 and 3, a first type of shield is of passive type. These are the shields shown by $S_1$ which comprises two N+ regions 15 and 16 and $S_3$ which comprises two N+ regions 17 and 18 and is completely identical to $S_1$. The small regions forming the shield $S_1$ are of the same type of conductivity as the collector region of the Darlington pair by which they are surrounded, but are much more strongly doped with respect to this region.

A first region 15 is located in contact with the insulating layer 8 of the chip and has a concentration of impurities of $5.10^{19}$ atoms/cm$^3$ in the zone of contact with this insulating layer. A second region 16 is buried below the previous layer at the interface between the epitaxial layers 2 and 4 and has a concentration of impurities of $1.10^{19}$ atoms/cm$^3$ in its central core. This passive shield $S_1$ reduces the current injected by the NPN parasitic transistor $T_{PD}$ and $T_{PF}$ into the isolation region of the integrated circuit since, as it is of a much more strongly doped N+ type with respect to the region N− which contains it, it reflects the holes and also because it reduces their gain as a result of the higher concentration of impurities which the shield introduces into their base region.

A second type of shield $S_2$, shown in FIGS. 2 and 3 between the passive shields $S_1$ and $S_3$ is of active type. It is formed by a P+ region 19 of conductivity opposite to that of the adjacent collector region 1-2-4 of the Darlington pair and more heavily doped with respect thereto and is connected via an electrode to the ground of the circuit arrangement in which the device is inserted. The region 19, in the high voltage configuration, is diffused below the insulating layer 8 of the chip with a concentration of impurities in contact therewith and in the central zone of $5 \times 10^{17}$ atoms/cm$^3$ up to the required depth, for example, throughout the entire thickness of the epitaxial layer 4. It reduces the gain of the parasitic transistors $T_{PD}$ and $T_{PF}$ since it acts in particular as an active shield in the sense that since it is connected to the ground of the device, it collects almost all the current injected by the parasitic transistors and therefore prevents its further supply to the isolation region of the integrated circuit.

Although a single embodiment of the present invention has been described and illustrated, it is obvious that many modifications and variants are possible without departing from the scope of the invention.

For example, the transistors of the Darlington pair do not necessarily have to have an exact rectangular shape. The drive transistor of the Darlington pair may be constructed by means of a slight interdigitation with the output transistor.

Moreover, the shield of semiconductor material disposed in accordance with the invention between the output transistor of the Darlington pair and the integrated circuit may be formed either by single shields of the two types described above or by combinations thereof, in accordance with design requirements known to persons skilled in the art.

Examples of single and combined shields are shown in FIGS. 4 and 3 respectively.

We claim:

1. A monolithically integrated semiconductor power device structure, comprising at least two power transistors and an integrated control circuit which are integrated monolithically in the same chip, comprising:
    a substrate of semiconductor material of a first type of conductivity bounded by an upper surface partially covered by an insulating layer and forming collector regions of said at least two power transistors;
    at least three regions of semiconductor material of a second type of conductivity opposite to said first type of conductivity and formed in said substrate from said upper surface below said insulating layer so as to form P-N junctions, a first of said three regions forming an isolation region of said integrated circuit which contains devices of said control circuit of said semiconductor power device, and a second region and a third region forming base regions of said power transistors;
    at least a fourth and fifth region of semiconductor material of said first type of conductivity forming emitter regions of said power transistors and formed from said upper surface below said insulating layer in said second and third regions respectively so as to form P-N junctions;
    a conductive means which establish ohmic contacts with said substrate and said base and emitter regions of said power transistors;
    wherein said two power transistors are connected in a Darlington pair configuration comprising a drive transistor and an output transistor, said output transistor of said Darlington pair being disposed in an intermediate position between said drive transistor of said Darlington pair and said integrated control circuit such that said drive transistor and said control circuit are not in mutual contact and said output transistor completely shields said drive transistor from said control circuit.

2. A device structure as claimed in claim 1, further comprising at least one shield disposed between said output transistor of said Darlington pair and said integrated control circuit formed by at least two regions of the same type of conductivity, a first of said two regions extending into said substrate from said upper surface below said insulating layer and a second of such two regions being buried in said substrate below said first region, both regions having their length substantially bounded by two opposite sides of said chip with no electrical connection to the exterior of said device.

3. A device as claimed in claim 1, further comprising at least one shield disposed between said output transistor of said Darlington pair and said integrated control circuit formed by a region of said second type of conductivity which extends into said substrate from said upper surface below said insulating layer so as to form a P-N junction having its length substantially bounded by two opposite sides of said chip and connected via a metal electrode to a ground of a circuit arrangement in which said semiconductor power device is inserted.

4. A device as claimed in claim 2, further comprising at least one shield disposed between said output transistor of said Darlington pair and said integrated control circuit formed by a region of said second type of conductivity which extends into said substrate from said upper surface below said insulating layer so as to form a P-N junction having its length substantially bounded by two opposite sides of said chip and connected via a metal electrode to a ground of a circuit arrangement in which said semiconductor power device is inserted.

5. A device as claimed in claim 1, wherein said output transistor of said Darlington pair is shaped using horizontal geometry with a rectangular shape substantially bounded by two opposite sides of said chip.

6. A device as claimed in claim 2, wherein said output transistor of said Darlington pair is shaped using horizontal geometry with a rectangular shape substantially bounded by two opposite sides of said chip.

7. A device as claimed in claim 3, wherein said output transistor of said Darlington pair is shaped using horizontal geometry with a rectangular shape substantially bounded by two opposite sides of said chip.

8. A device as claimed in claim 4, wherein said output transistor of said Darlington pair is shpaed using horizontal geometry with a rectangular shape substantially bounded by two opposite sides of said chip.

9. A structure as claimed in claim 1, wherein said device transistor of said Darlington pair is constructed using horizontal geometry with a shape which is at least partially interdigitated with that of said output transistor.

10. A structure as claimed in claim 2, wherein said device transistor of said Darlington pair is constructed using horizontal geometry with a shape which is at least partially interdigitated with that of said output transistor.

11. A structure as claimed in claim 3, wherein said device transistor of said Darlington pair is constructed using horizontal geometry with a shape which is at least partially interdigitated with that of said output transistor.

12. A structure as claimed in claim 3, wherein said integrated control circuit, said power transistors and said at least one shield each contain at least one high voltage P-N junction constructed with a stepped profile and a concentration of impurities in one of the two sides of said junction which decreases from its center to its periphery over a predetermined horizontal extension so as to minimize the mean intensities of the surface electrical field for a predetermined breakdown voltage of the junction itself.

13. A structure as claimed in claim 4, wherein said integrated control circuit, said power transistors and said at least one shield each contain at least one high voltage P-N junction constructed with a stepped profile and a concentration of impurities in one of the two sides of said junction which decreases from its center to its periphery over a predetermined horizontal extension so as to minimize the mean intensities of the surface electrical field for a predetermined breakdown voltage of the junction itself.

14. A structure as claimed in claim 5, wherein said integrated control circuit, said power transistors and said at least one shield each contain at least one high voltage P-N junction constructed with s stepped profile and a concentration of impurities in one of the two sides of said junction which decreases from its center to its periphery over a predetermined horizontal extension so as to minimize the mean intensities of the surface electrical field for a predetermined breakdown voltage of the junction itself.

15. A structure as claimed in claim 6, wherein said integrated control circuit, said power transistors and said at least one shield each contain at least one high voltage P-N junction constructed with a stepped profile and a concentration of impurities in one of the two sides of said junction which decreases from its center to its periphery over a predetermined horizontal extension so as to minimize the mean intensities of the surface electrical field for a predetermined breakdown voltage of the junction itself.

16. A structure as claimed in claim 7, wherein said integrated control circuit, said power transistors and said at least one shield each contain at least one high voltage P-N junction constructed with a stepped profile and a concentration of impurities in one of the two sides of said junction which decreases from its center to its periphery over a predetermined horizontal extension so as to minimize the mean intensities of the surface electrical field for a predetermined breakdown voltage of the junction itself.

17. A structure as claimed in claim 8, wherein said integrated control circuit, said power transistors and said at least one shield each contain at least one high voltage P-N junction constructed with a stepped profile and a concentration of impurities in one of the two sides of said junction which decreases from its center to its periphery over a predetermined horizontal extension so as to minimize the mean intensities of the surface electrical field for a predetermined breakdown voltage of the junction itself.

18. A structure as claimed in claim 9, wherein said integrated control circuit, said power transistors and said at least one shield each contain at least one high voltage P-N junction constructed with a stepped profile and a concentration of impurities in one of the two sides of said junction which decreases from its center to its periphery over a predetermined horizontal extension so as to minimize the mean intensities of the surface electrical field for a predetermined breakdown voltage of the junction itself.

19. A structure as claimed in claim 10, wherein said integrated control circuit, said power transistors and said at least one shield each contain at least one high voltage P-N junction constructed with a stepped profile and a concentration of impurities in one of the two sides of said junction which decreases from its center to its periphery over a predetermined horizontal extension so as to minimize the mean intensities of the surface electrical field for a predetermined breakdown voltage of the junction itself.

20. A structure as claimed in claim 11, wherein said integrated control circuit, said power transistors and said at least one shield each contain at least one high voltage P-N junction constructed with a stepped profile and a concentration of impurities in one of the two sides of said junction which decreases from its center to its periphery over a predetermined horizontal extension so as to minimize the mean intensities of the surface electrical field for a predetermined breakdown voltage of the junction itself.

* * * * *